United States Patent
Leong et al.

(10) Patent No.: US 9,948,289 B2
(45) Date of Patent: Apr. 17, 2018

(54) SYSTEM AND METHOD FOR A GATE DRIVER

(71) Applicant: Infineon Technologies Austria AG, Villach (AT)

(72) Inventors: Kenneth Kin Leong, Villach (AT); Hadiuzzaman Syed, Villach (AT); Chris Notsch, Villach (AT)

(73) Assignee: Infineon Technologies Austria AG, Villach (AT)

(*) Notice: Subject to any disclaimer, the term of this patent is extended or adjusted under 35 U.S.C. 154(b) by 0 days.

(21) Appl. No.: 14/728,457

(22) Filed: Jun. 2, 2015

(65) Prior Publication Data
US 2016/0359481 A1 Dec. 8, 2016

(51) Int. Cl.
*H03K 3/00* (2006.01)
*H03K 17/16* (2006.01)

(52) U.S. Cl.
CPC ... *H03K 17/163* (2013.01); *H03K 2217/0072* (2013.01)

(58) Field of Classification Search
CPC .... H03K 17/601; H03K 17/64; H03K 17/691; H03K 17/731; H03K 17/04123; H03K 17/04163; H03K 2217/0036
USPC .......................................................... 327/109
See application file for complete search history.

(56) References Cited

U.S. PATENT DOCUMENTS

| | | | |
|---|---|---|---|
| 6,433,592 B1* | 8/2002 | Ehben | H03K 17/163 326/33 |
| 7,091,753 B2* | 8/2006 | Inoshita | H02M 1/08 327/108 |
| 2012/0068683 A1* | 3/2012 | Liu | H02M 1/08 323/311 |

OTHER PUBLICATIONS

Chung, H., et al., "Suppression of Spurious Triggering in Synchronous Buck Converter With Switched-Capacitor Gate Driver," IEEE Energy Conversion Congress & Expo, Denver, Colorado, Sep. 15-19, 2013, 21 pgs.
Tueysuez, A., et al., "Performance Comparison of a GaN GIT and a Si IGBT for High-Speed Drive Applications," IEEE, The 2014 International Power Electronics Conference, May 2014, 9 pages.
Zhang, Z. et al., "A Dual-Channel Isolated Resonant Gate Driver for Low Gate Drive Loss in ZVS Full-Bridge Converters," 2013 Twenty-Eighth Annual IEEE Applied Power Electronics Conference and Exposition (APEC), Mar. 17-21, 2013, pp. 31-37.

* cited by examiner

*Primary Examiner* — Patrick Chen
(74) *Attorney, Agent, or Firm* — Slater Matsil, LLP

(57) ABSTRACT

In accordance with an embodiment, method of controlling a switching transistor includes applying a first voltage to a first node of a switchable tank circuit, where the first node is coupled to a control node of the switching transistor, the first voltage has a first polarity with respect to a reference terminal of the switching transistor, and the first voltage is configured to place the switching transistor into a first state. After applying the first voltage, the switchable tank circuit is activated, where a voltage of the first node transitions from the first voltage to a second voltage that is configured to place the switching transistor in a second state different from the first state. The switchable tank circuit is deactivated after the voltage of the first node attains the second polarity.

37 Claims, 6 Drawing Sheets

$T \approx \frac{1}{2}$ *Resonant Cycle*

SYSTEM AND METHOD FOR A GATE
DRIVER

TECHNICAL FIELD

This disclosure relates generally to an electronic device, and more particularly, to a system and method for a gate driver.

BACKGROUND

Switched-mode circuits, including switched-mode power supplies and motor controllers, are pervasive in many electronic applications from computers to automobiles. Generally, voltages within a switched-mode power supply system are generated by performing a DC-DC, DC-AC, and/or AC-DC conversion by operating a switch coupled to an inductor or a transformer. Switched-mode power supplies are usually more efficient than other types of power conversion systems because power conversion is performed by controlled charging and discharging a low loss component, such as an inductor or transformer, therefore reducing energy lost due to power dissipation across resistive voltage drops. Similarly, switched-mode motor controllers may be used to efficiently commutate DC brushless motors with low losses in the driving circuitry.

With respect to implementing a switched-mode circuit, specialized driving circuitry is used to efficiently drive a switching transistor coupled to the various magnetic components. Such circuitry may be configured to provide switching signals at appropriate speeds and voltage levels. These voltage levels may be established, for example, by using external DC supply voltages, voltage regulators, level shifters, charge pumps and other circuits to ensure that the switching transistor is turned-on and off. In addition to establishing appropriate voltage levels, switching transistor driving circuits may also be designed to mitigate the effects of voltage transients caused by the fast switching of inductive loads. Such effects may include, for example, voltage overshoot seen at the switching transistor and/or the ringing or oscillations due to stray inductance and parasitic capacitance.

SUMMARY

In accordance with an embodiment, method of controlling a switching transistor includes applying a first voltage to a first node of a switchable tank circuit, where the first node is coupled to a control node of the switching transistor, the first voltage has a first polarity with respect to a reference terminal of the switching transistor, and the first voltage is configured to place the switching transistor into a first state. After applying the first voltage, the switchable tank circuit is activated, where a voltage of the first node transitions from the first voltage to a second voltage that is configured to place the switching transistor in a second state different from the first state. The switchable tank circuit is deactivated after the voltage of the first node attains the second polarity.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for driving a switching MOSFET. Embodiments of the present invention may also be applied to various systems that utilize switching transistors, such as switched-mode power supplies, and various H-Bridge drivers. Embodiments may also be directed to driving any power devices that have low threshold gate voltages, such as a low voltage and low power gallium nitride (GaN) MOSFET gate-injection transistors.

In an embodiment of the present invention, a gate driving circuit that is powered by a positive power supply is configured to provide a negative driving voltage to the control node of a switching transistor. This is done by using a switchable resonant tank to provide the negative gate drive voltage. This switchable resonant tank may include an inductor coupled to the gate capacitance of the switching transistor via a switch. In an embodiment, the switching transistor is turned ON by applying a positive voltage to the gate of the switching transistor. The switching transistor is then turned OFF by connecting the inductor to the gate capacitance via the switch to activate the resonant tank. The switch is activated long enough to allow the voltage across the resonant tank to reverse polarity, and then deactivated in order to hold the gate of the switching transistor at a negative voltage. In some embodiments, this time period corresponds to about one-half on one resonant time period of the resonant tank.

Figure 1:
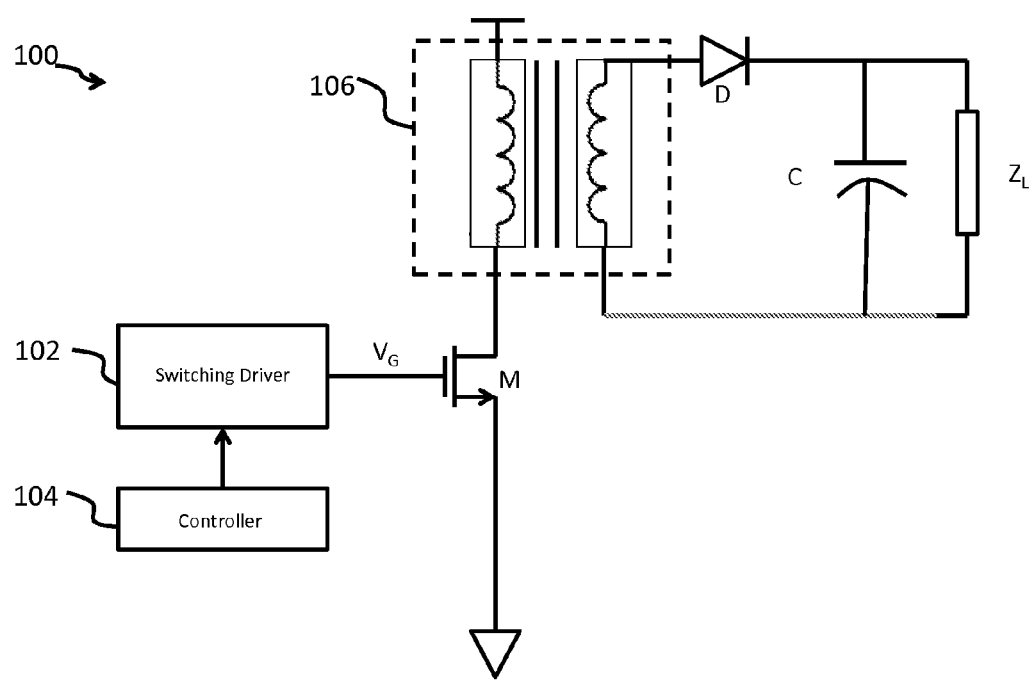
FIG. 1 illustrates an example system that utilizes a switching transistor driver.

FIG. 1 illustrates an exemplary flyback converter 100 that includes switching transistor M coupled to a primary winding of transformer 106. During operation, switching transistor M is turned-on and off via switch driver 102 and magnetizes the primary winding of transformer 106. When switching transistor M is turned-off, current induced in the secondary winding of transformer 106 charges capacitor C and provides power to a load represented by load impedance $Z_L$ via rectifying diode D. Controller 104 provides a pulsewidth modulated signal to switch driver 102 and may be used to control the output voltage and/or output current for flyback converter 100.

Transistor M may be implemented as an enhancement-mode device having a threshold voltage greater than zero. Switch driver 102 turns on transistor M using a turn-on voltage that exceeds the threshold of transistor M and turns off transistor M by grounding the gate of transistor M. If switching transistor M has a relatively low gate threshold (e.g., 1 V), disturbances and switching within flyback converter 100 may momentarily turn-on transistor M when even though gate voltage $V_G$ is set to zero V. Parasitic inductance at the source of transistor M, for example, due to wiring inductance, may exacerbate the effect of this spurious turn-on of transistor M. Accordingly, in embodiments of the present invention, switch driver 102 is configured to provide a negative turn-off voltage to help ensure that transistor M remains turned-off in the presence of transients within flyback converter 100.

Figure 2A:
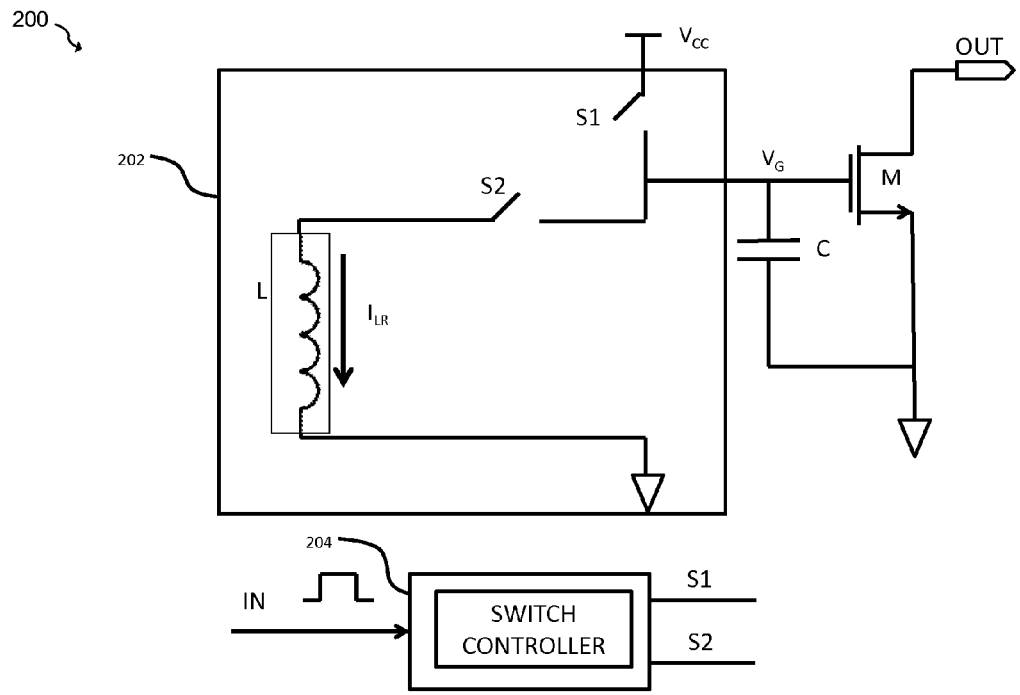
FIG. 2a illustrates an embodiment switch driver circuit and FIG. 2b illustrates an embodiment timing diagram.

FIG. 2a illustrates an embodiment gate driving system 200 that includes gate driver 202 configured to drive the gate of transistor M, and switch controller 204 coupled to gate driver 202. As shown, gate driver 202 includes switch S1 that is used to pull the gate of the switching transistor M to Vcc, thereby turning on transistor M, and switch S2 that is used to connect inductor L and capacitance C together to form a LC tank that resonates when switch S2 is closed. The combination of switch S2, inductor L and capacitance C effectively form a switchable tank circuit. In some embodiments, by selectively activating and deactivating the resonant condition of the LC tank, the gate voltage $V_G$ of transistor M may set to both positive and negative voltages even though no negative power supply is present. It should be further understood that, in many embodiments, the gate-source capacitance of transistor M forms the main portion of capacitance C. In various embodiments, inductor L may be implemented using discrete and/or integrated inductors and capacitance C may be implemented using discrete and/or integrated capacitors. In alternative embodiments, the placement of S2 and inductor L may be interchangeable.

In an embodiment, switching transistor M is shown implemented as an n-channel MOSFET. Alternatively, other device types may be used to implement switching transistor M including, but not limited to a p-channel MOSFET, an insulated gate bipolar transistor (IGBT), a gallium nitride enhancement mode gate-injection transistor (GaN GIT), GaN high electron mobility transistor (GaN HEMT), a bipolar junction transistor (BJT), a junction field-effect transistor (JFET) or a gate turn-off thyristor GTO (Gate Turn-Off Thyristor) may be used as well. The same applies to other electronic switches that will be explained herein below.

During operation, transistor M is turned on by closing switch S1 when switch S2 is open in order to pull the gate voltage $V_G$ of transistor M to Vcc. Next, transistor M is turned-off by opening S1 and closing S2 in order to form a parallel resonant tank circuit made of inductor L and capacitance C. By closing S2, a closed loop is formed between S2, L and C, and a resonant condition is established in which energy starts transferring back and forth between inductance L and capacitance C, thereby causing gate voltage $V_G$ to transition from a positive voltage to a negative voltage. Accordingly, a negative voltage with respect to the source of transistor M is produced at the gate of transistor M during a negative quarter-cycle of the resonant condition. The time during which switch S2 is turned-on is controlled in order to provide a negative gate voltage $V_G$ to transistor M.

In an embodiment, the controlling signals for S1 and S2 are generated by switch controller 204 that generates two non-overlapping signals that turn S1 and S2 on and off. The duration $Ton_{S2}$ of S2 is pre-determined based on the values of inductor L and capacitance C. The voltage of $V_G$ is not greater than zero when the duration of $Ton_{S2}$ between one quarter and three quarters of a resonant period:

$$f = \frac{1}{2\pi\sqrt{LC}}; \text{ and}$$

$$\frac{\pi}{2}\sqrt{LC} < Ton_{S2} < \frac{3\pi}{2}\sqrt{LC},$$

where f is the resonant frequency of the tank.

Figure 2B:
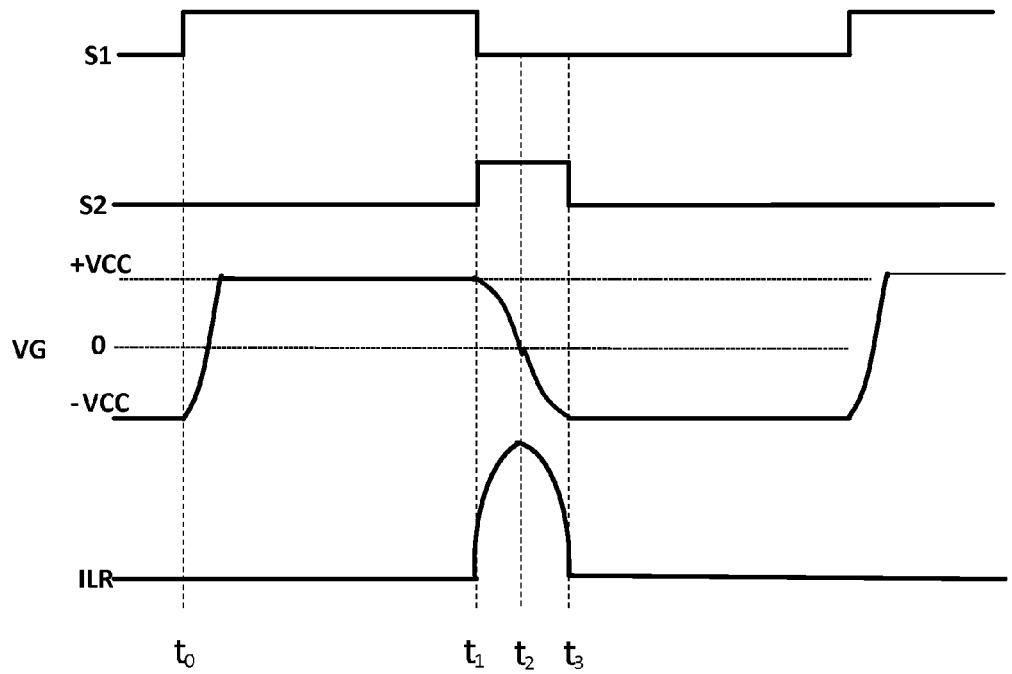

FIG. 2b illustrates a waveform diagram for various signals within embodiment gate driving system 200 with timing information in horizontal axis and voltage and current information in the vertical axis. The waveforms labeled S1 and S2 correspond to the switch control signals for switches S1 and S2, the waveform labeled $V_G$ corresponds to the gate voltage of transistor M, and the waveform labeled ILR corresponds to the current through inductor L. In an embodiment, it is assumed that before time t0, the switches S1 and S2 are open, and gate voltage $V_G$ is at −Vcc, due to charging from previous cycle.

At time $t_0$, the switch S1 turns on and provides charging current to charge the gate of the switching transistor M to Vcc. Once the gate of transistor M is charged, there is no further current from Vcc and switch S1 remains on until time $t_1$, at which time switch S1 is opened and switch S2 is closed. In some embodiments, the control signals to switches S1 and S2 are non-overlapping to ensure that switch S1 turns off before switch S2 turns on. In another embodiment, S1 and S2 can overlap in order to pre-charge L first to ground and then switch off S1 and inject current into the negative side of C from a much higher negative current in order to increase turn-off speed.

When switch S2 is turned on at time $t_1$, capacitance C is connected to inductor L. The resonant circuit is thus formed and energy is transferred to inductor L. Accordingly, inductor current $I_{LR}$ starts increasing as voltage across the capacitor C starts decreasing. Voltage $V_G$ changes polarity at $t_2$, and reaches a maximum negative voltage at $t_3$, when S2 is turned off. After time $t_3$, switches S1, S2 remains off, and the negative voltage across the gate of transistor M remains unchanged as long as there are no leakage paths available from the gate. The cycle repeats once switch S1 is turned on again.

Figure 3A:
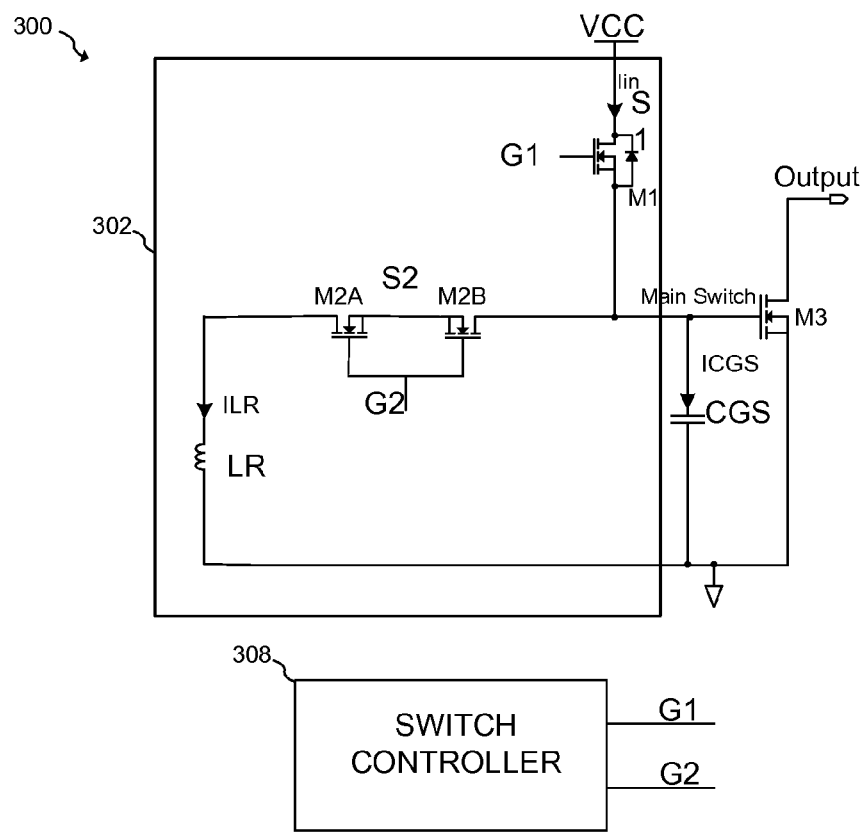
FIGS. 3a-3b illustrate gate driver system according to another embodiment.

FIG. 3a illustrates another embodiment system 300 that includes switching gate driver 302 coupled to transistor M3. In an embodiment, switch S1 is implemented using transistor M1 and switch S2 is implemented using a series combination of transistors M2a and M2b having a back-to-back configuration for bi-directional blocking, such that inductor LR, switch S2 and CGS form a switchable tank circuit. In an embodiment, transistors M1, M2a and M2b are implemented using n-channel MOSFETs. Alternatively, other types of transistors or devices may be used, for example, a p-channel MOSFETs, BJTs or a JFET, or other device types depending on the particular embodiment and its specifications.

As shown, transistors M2a and M2b of switch S2 share a common source and body connection in order to prevent current flow when switch S1 is on. In an alternative embodiment, transistors M2a and M2b may share a common drain connection with separate body connections such that their respective body diodes are oriented in opposite directions.

Figure 3B:
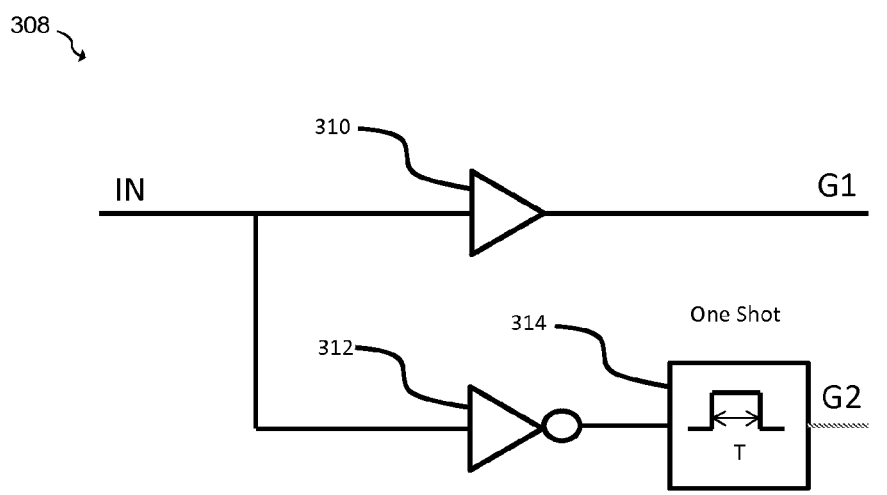

FIG. 3b illustrates an embodiment switch controller 308 that may be used to generate the control signals G1 and G2 which are used to drive switches S1 and S2 for embodiment system 300 shown in FIG. 3a and for other embodiments, such as embodiment system 200 shown in FIG. 2a. As shown, switch controller 308 includes a buffer 310 to drive switch S1 with the control signal G1, an inverter 312 to produce an inverted signal of G1 followed by an one shot circuit 314 to control the on time T of signal G2. This on time is represented by time T, which are typically one-half of the resonant cycle and a function of the value of resonant inductor and capacitor. One shot circuit 314 may be implemented, for example using an analog timing circuit or may be implemented using a digital timing circuit such as a counter. In some embodiments, one shot circuit 314 may be configured to have an adjustable on-time. It should be understood that the circuit of FIG. 3b is just one example of many ways to implement an embodiment switch controller. Alternatively, other logically similar or equivalent circuits may be used.

Figure 4A:
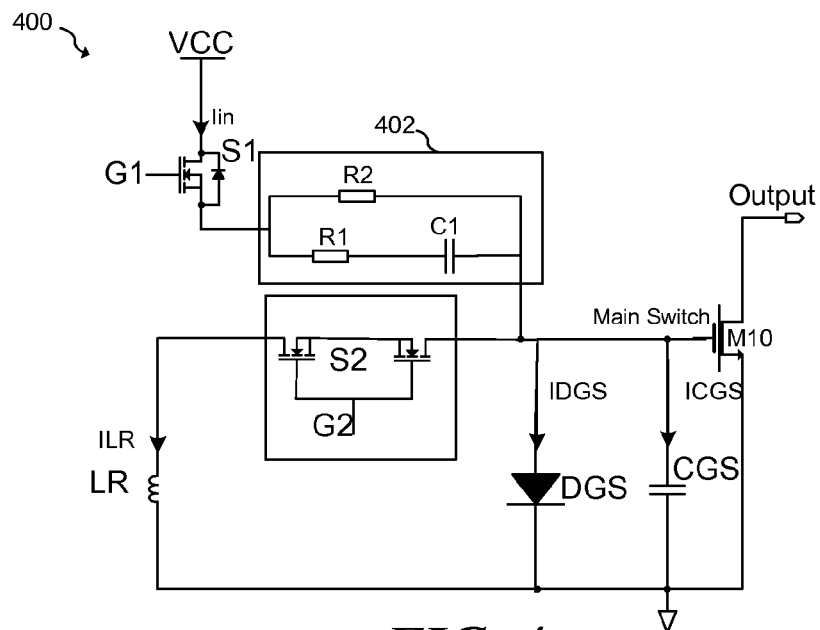
FIGS. 4a-4b illustrate a gate driver according to a further embodiment.

FIG. 4a illustrates further embodiment gate drive system 400 that is adapted to drive an enhancement mode GaN GIT M10. As shown, embodiment gate drive system 400 is similar to the gate driver 302 in FIG. 3a with the addition of RC network 402 that is used to control the slew rate of the gate drive signal. Diode DGS represents the diode characteristics of the gate of GaN GIT M10, which may be used to ensure that gate to source voltage of M10 does not exceed its maximum rated voltage. The function of this system is similar to the embodiment system 300 illustrated in FIG. 3a, with the addition of RC network 402 that includes a parallel combination of R2 and R1 in series with C1. Capacitor CGS represents the gate to source equivalent capacitance of the transistor M10. In a further embodiment, a Zener diode is coupled in parallel with diode DGS to limit the maximum negative voltage that can occur across the gate of the device.

During operation, the gate of GaN GIT M10 is turned on by activating switch S1. The gate is charged by $I_{CGS}$ that is the current flowing through RC network 402. The diode current $I_{DGS}$ does not flow until the gate voltage has crossed the positive threshold voltage of the diode. RC network 402 controls the maximum gate charging current, and R2 controls the continuous gate current to keep the device in conduction. The gate discharge is implemented by turning off S1, and turning on S2 to activate the LC resonant tank circuit, similar to embodiment illustrated in FIG. 3a.

Figure 4B:
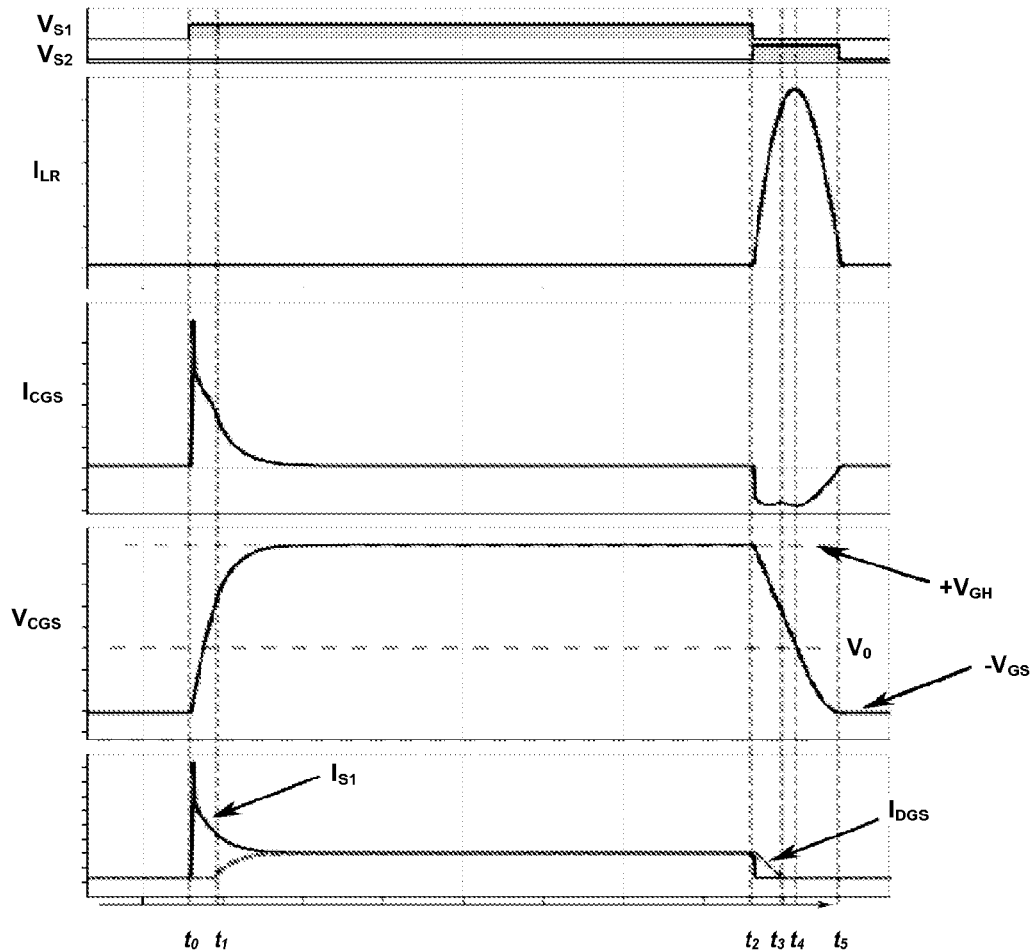

FIG. 4b illustrates a waveform diagram showing various signals within embodiment gate drive system 400 showing timing information in horizontal axis and voltage and current information in the vertical axis. The waveforms labeled $V_{S1}$ and $V_{S2}$ correspond to the switch control signals of switch S1 and S2, the waveform labeled $V_{CGS}$ corresponds to gate to source voltage of transistor M10, waveform labeled $I_{LR}$ corresponds to the current flowing through inductor LR, waveform labeled $I_{CGS}$ corresponds to the current flowing through CGS, waveform labeled $I_{S1}$ corresponds to current flowing through switch S1, and waveform labeled $I_{DGS}$ corresponds to the current flowing through diode DGS.

As shown in FIG. 4b, the switches S1 and S2 are open before time $t_0$, and the gate voltage $V_{CGS\ is}$ charged to $-V_{GS}$ from the previous cycle. At time $t_0$, switch S1 is activated, and gate source capacitance CGS is discharged via current $I_{CGS}$. Accordingly, gate voltage $V_{CGS}$ begins to transition from a negative voltage to a positive voltage. At time $t_1$, gate voltage $V_{CGS}$ crosses the diode forward threshold voltage and $I_{DGS}$ starts flowing. When the gate voltage $V_{CGS}$ reaches its maximum voltage $V_{GH}$, current $I_{CGS}$ goes to zero and current $I_{S1}$ flowing through switch S1 is the diode current $I_{DGS}$. At time $t_2$ switch S1 is opened and S2 is closed and current ILR flows through the inductor L and increases over time. This current discharges the gate of transistor M10 such that the gate to source voltage $V_{CGS}$ decreases. Diode current $I_{DGS}$ also flows until $V_{CGS}$ falls below the threshold voltage at time $t_3$. Next, voltage $V_{CGS}$ changes its polarity at time $t_4$ and inductor current ILR stops increasing and starts decreasing. The switch S2 is kept on until time $t_5$ when S2 is turned off as $V_{CGS}$ reached $-V_{GS}$. The gate voltage remains at $-V_{GS\ until}$ the cycle is repeated by turning on S1 again.

Figure 5A:
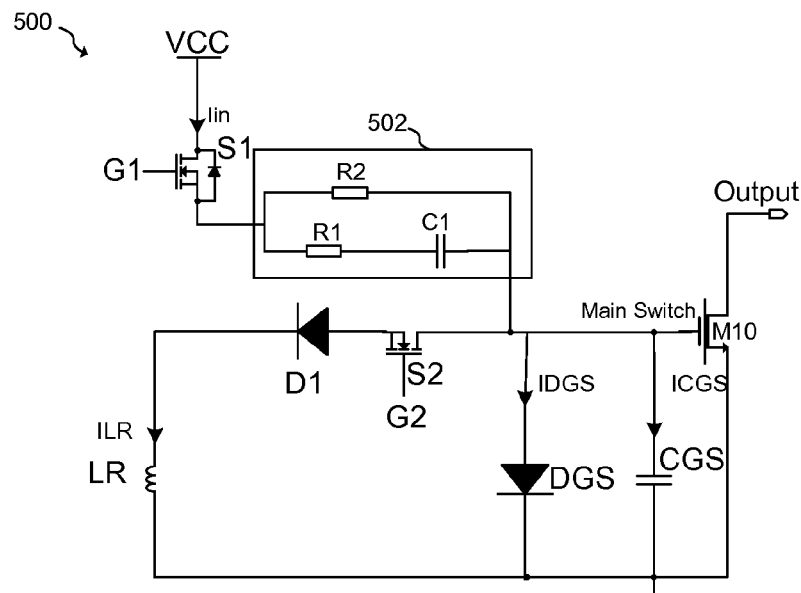
FIGS. 5a-5b illustrate a gate driver according to a further embodiment.
Figure 5B:
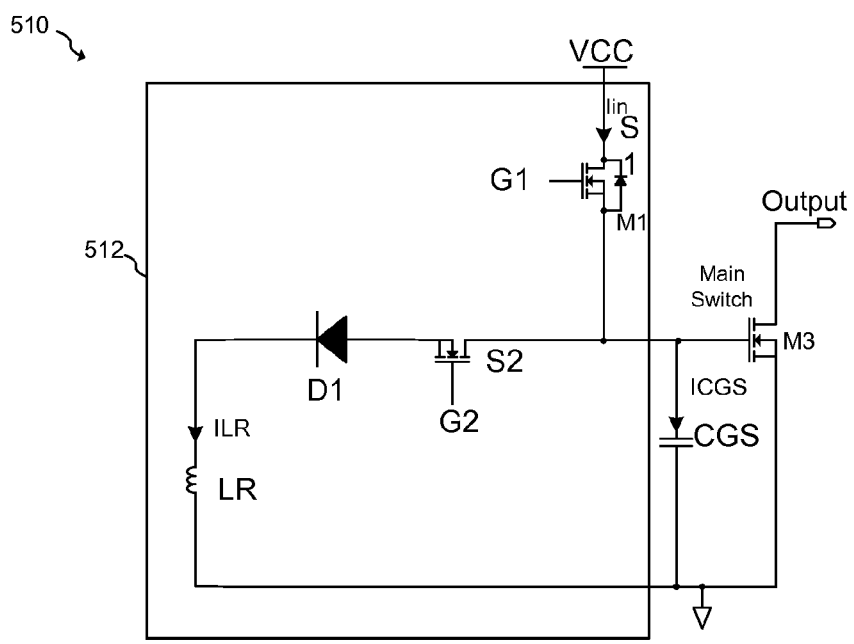

FIG. 5a illustrates further embodiment gate driver system 500 that is similar to embodiment system 400. In this embodiment S2 is implemented using an n-channel MOSFET and it is coupled to an anode of a diode D1, such that inductor LR, diode D1 and CGS form a switchable tank circuit. A cathode of the diode D1 is coupled to a first terminal of an inductor LR. The diode D1 is utilized to block current flow from the inductor when S2 is off and the body diode is forward biased. The polarity of diode D1 can be reversed if the polarity of the body diode of S2 is reversed. In addition, the position of S2 and D1 could likely be switched. FIG. 5b illustrates further embodiment gate driver system 510 that is similar to embodiment system 300. In this embodiment S2 comprises a MOSFET and it is coupled to an anode of a diode D1. A cathode of the diode D1 is coupled to a first terminal of an inductor LR. The diode D1 and the body diode of the MOSFET have to be back to back to avoid current conduction when the S2 is off.

Figure 6:
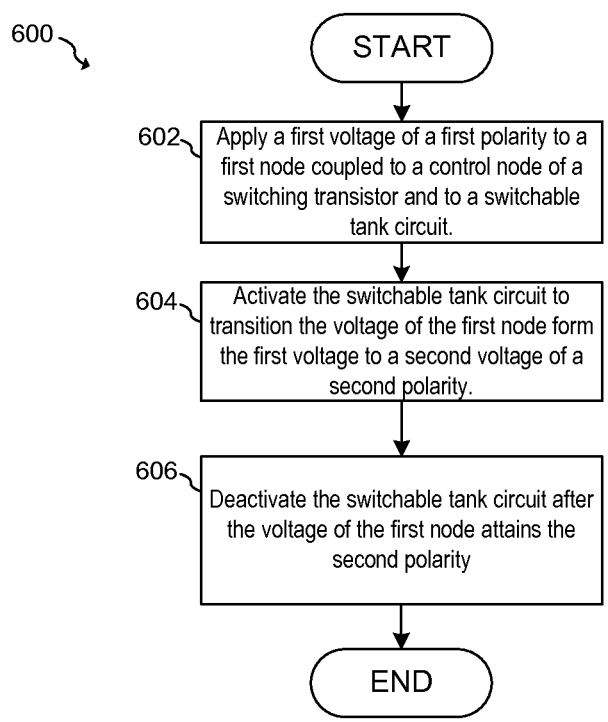
FIG. 6 illustrates a flowchart of an embodiment method.

FIG. 6 illustrates a flowchart of an embodiment method 600 of controlling a switching transistor. In step 602, a first voltage is applied to a first node of a switchable tank circuit. In an embodiment, the first node is coupled to a control node of the switching transistor, the first voltage has a first polarity with respect to a reference terminal of the switching transistor, and the first voltage is configured to place the switching transistor into a first state. Next in step 604, the switchable tank circuit is activated, such that a voltage of the first node transitions from the first voltage to a second voltage and the second voltage has a second polarity opposite the first polarity with respect to the reference terminal of the switching transistor. In an embodiment, this second voltage is configured to place the switching transistor in a second state different from the first state. Finally, in step 606, the switchable tank circuit is deactivated after the voltage of the first node attains the second polarity. In some embodiments, the first state is an on-state and the second state is an off-state.

Embodiments of the present invention may be applied to various switching applications. For example, embodiment gate drivers may be used in switched-mode power supplies, such as the flyback converter shown in FIG. 1, and may be used to drive switches in half-bridge and full bridge circuits that are used, for example, in motor controllers and other circuits.

In accordance with various embodiments, circuits or systems may be configured to perform particular operations or actions by virtue of having software, firmware, hardware, or a combination of them installed on the system that in operation causes or cause the system to perform the actions. One general aspect includes a method of controlling a switching transistor that includes applying a first voltage to a first node of a switchable tank circuit, where the first node is coupled to a control node of the switching transistor, the first voltage has a first polarity with respect to a reference terminal of the switching transistor, and the first voltage is configured to place the switching transistor into a first state. After applying the first voltage, the switchable tank circuit is activated, such that a voltage of the first node transitions from the first voltage to a second voltage, the second voltage has a second polarity opposite the first polarity with respect to the reference terminal of the switching transistor, and the second voltage is configured to place the switching transistor in a second state different from the first state. The switchable tank circuit is deactivated after the voltage of the first node attains the second polarity. Other embodiments of this aspect include corresponding computer systems, apparatus, and computer programs recorded on one or more computer storage devices, each configured to perform the actions of the methods.

Implementations may include one or more of the following features. The method where the switchable tank includes an inductor having a first terminal coupled to the reference terminal of the switching transistor, an input gate capacitance at a control node of the switching transistor, and a tank switch coupled between the control node of the switching transistor and a second terminal of the inductor. Activating the switchable tank may include turning on the tank switch.

In an embodiment, applying the first voltage includes turning on a first switch coupled between supply terminal and the control node of the switching transistor. Activating the switchable tank may include, for example, connecting an inductor between a control node of the switching transistor and a reference terminal of the switching transistor and deactivating the switchable tank circuit may include disconnecting the inductor between the control node of the switching transistor and the reference terminal of the switching transistor. In some embodiments, the switching transistor includes a low threshold MOSFET.

In an embodiment, the first state includes an on state and the second state includes an off state. The first polarity may include a positive polarity with respect to the reference terminal of the switching transistor, and the second polarity may include a negative polarity with respect to the reference terminal of the switching transistor. In some embodiments, activating the switchable tank circuit includes activating the tank circuit for a predetermined time period, where the predetermined time period is between one-quarter and three-quarters of a resonant time period of the switchable tank circuit. In one example, he predetermined time period is one-half of the resonant time period. The first voltage may include a first power supply voltage and the reference terminal of the switching transistor may be coupled to ground. Implementations of the described techniques may include hardware, a method or process, or computer software on a computer-accessible medium.

One general aspect includes a gate driver circuit that includes a switchable tank circuit having a first node configured to be coupled to a switching transistor and a control circuit configured to apply a first voltage to a first node of the switchable tank circuit, activate the switchable tank circuit after applying the first voltage to the first node and deactivate the switchable tank circuit after the voltage of the first node attains the second polarity. The first voltage has a first polarity with respect to a reference terminal of the switching transistor, the first voltage is configured to place the switching transistor into a first state, a voltage of the first node transitions from the first voltage to a second voltage, the second voltage has a second polarity opposite the first polarity with respect to the reference terminal of the switching transistor, and the second voltage is configured to place the switching transistor in a second state different from the first state. Other embodiments of this aspect include corresponding computer systems, apparatus, and computer programs recorded on one or more computer storage devices, each configured to perform the actions of the methods.

Implementations may include one or more of the following features. The gate driver where the switchable tank includes an inductor having a first terminal coupled to the reference terminal of the switching transistor and a tank switch having a first end coupled to a second terminal of the inductor and a second end configured to be coupled to the switching transistor. The gate driver may further include the switching transistor, and the switchable tank may further include an input capacitance of the switching transistor.

In an embodiment, the tank switch includes a first MOSFET coupled in series with a second MOSFET, where a body diode of the first MOSFET has an opposite polarity of a body diode of the second MOSFET. The controller may be configured to activate the switchable tank circuit by turning on the second switch and deactivate the switchable tank circuit by turning off the tank switch. In various embodiments, the gate driver further includes a first switch coupled between a power supply node and the first node, and the controller is configured to apply the first voltage by turning on the first switch. In some embodiments, the controller is configured to activate the switchable tank circuit for a predetermined time period, and the predetermined time period is between one-quarter and three-quarters of a resonant time period of the switchable tank circuit. Implementations of the described techniques may include hardware, a method or process, or computer software on a computer-accessible medium.

One general aspect includes a switching gate driver circuit including a first switch coupled between a gate driver terminal and a first power supply node, a second switch having a first terminal coupled to the gate driver terminal, and an inductor coupled between a second terminal of the gate driver terminal and a second supply terminal. The gate driver terminal is configured to be coupled to a gate of a switching transistor. Other embodiments of this aspect include corresponding computer systems, apparatus, and computer programs recorded on one or more computer storage devices, each configured to perform the actions of the methods.

Implementations may include one or more of the following features. The circuit further including a controller having a first switch control output coupled to a control node of the first switch and a second switch control output coupled to a control node of the second switch, where the controller is configured to turn-off the switching transistor by asserting a second switch control signal at the second switch control output for a predetermined time period. The predetermined time period may be between one-quarter and three quarters of a resonant time period of an LC tank formed by the inductor and a capacitance of the switching transistor.

In some embodiments, the first switch is implemented using a MOSFET, and/or the second switch is implemented using two MOSFETs connected in series, where source connections and body connections of the two MOSFETs are connected together. In an embodiment, when the second switch is turned on, the inductor and an input capacitance of the switching transistor form an LC resonant circuit. In some embodiments, the circuit further includes the switching transistor, which may be implemented, for example, by an enhancement mode GaN GIT device. Implementations of the described techniques may include hardware, a method or process, or computer software on a computer-accessible medium.

An advantage of some embodiments include the ability to implement a gate driver circuit that produces a positive and negative gate drive voltage using a relatively low number of components and without needing an external positive and negative power supply. A further advantage includes the ability to suppress the effect of spurious transients and noise transients on the operation of a switching transistor by providing a positive and negative gate drive voltage using a resonant inductor. Such an ability to mitigate the effects of spurious transients make embodiments of the invention particularly suitable for driving low threshold voltage power switching devices, such as enhancement mode GaN GIT devices that may be otherwise prone to spurious noises due to its low threshold voltage.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of controlling a switching transistor, the method comprising:
    applying a first voltage to a first node of a switchable tank circuit by turning on a first switch coupled between a first supply terminal and the first node, the switchable tank circuit comprising a resonant inductor and a resonant capacitor, wherein
        the first node is coupled to a control node of the switching transistor,
        the resonant capacitor is coupled between the first node and a reference terminal of the switching transistor, and
        the resonant inductor is coupled between the first node and the reference terminal of the switching transistor,
        the first voltage has a first polarity with respect to the reference terminal of the switching transistor, and
        the first voltage is configured to place the switching transistor into a first state;
    after applying the first voltage, activating the switchable tank circuit by turning on a second switch coupled between the first node and the reference terminal of the switching transistor and in series with the resonant inductor, wherein
        a voltage of the first node transitions from the first voltage to a second voltage,
        the second voltage has a second polarity opposite the first polarity with respect to the reference terminal of the switching transistor, and
        the second voltage is configured to place the switching transistor in a second state different from the first state;
    deactivating the switchable tank circuit and isolating the control node of the switching transistor from the first supply terminal and from the reference terminal of the switchable tank circuit by turning off the second switch after the voltage of the first node attains the second polarity; and
    after deactivating the switchable tank circuit, holding the second voltage at the control node of the switching transistor unaided by a power generator, wherein
        when the first switch is closed, the second switch is open, and
        when the second switch is closed, the first switch is open.

2. The method of claim 1, wherein:
    activating the switchable tank circuit comprises connecting an inductor between the control node of the switching transistor and a reference terminal of the switching transistor; and
    deactivating the switchable tank circuit comprises disconnecting the inductor between the control node of the switching transistor and the reference terminal of the switching transistor.

3. The method of claim 1, wherein the switching transistor comprises a low threshold MOSFET.

4. The method of claim 1, wherein:
    the first state comprises an ON state; and
    the second state comprises an OFF state.

5. The method of claim 1, wherein:
    the first polarity comprises a positive polarity with respect to the reference terminal of the switching transistor; and
    the second polarity comprises a negative polarity with respect to the reference terminal of the switching transistor.

6. The method of claim 1, wherein activating the switchable tank circuit comprises activating the switchable tank circuit for a predetermined time period, and the predetermined time period is between one-quarter and three-quarters of a resonant time period of the switchable tank circuit.

7. The method of claim 6, wherein the predetermined time period is one-half of the resonant time period.

8. The method of claim 1, wherein the first voltage comprises a first power supply voltage and the reference terminal of the switching transistor is coupled to ground.

9. The method of claim 1, wherein a first terminal of the first switch is directly coupled to the first node of the switchable tank circuit.

10. The method of claim 1, further comprising controlling a slew rate of the control node of the switching transistor using an RC network coupled between a first terminal of the first switch and the control node of the switching transistor.

11. The method of claim 1, wherein holding the second voltage at the control node of the switching transistor comprises holding a voltage of the control node at a time when an inductor current reaches zero, and the second voltage is held until applying the first voltage to the first node of a switchable tank circuit.

12. The method of claim 1, wherein the resonant capacitor comprises a capacitance a gate-to-source capacitance of the switching transistor.

13. A gate driver circuit comprising:
    a switchable tank circuit comprising
        a first node configured to be coupled to a switching transistor,
        a resonant capacitor coupled between the first node and a reference terminal of the switching transistor, and
        a resonant inductor coupled between the first node and the reference terminal of the switching transistor;
    a first switch coupled between a first supply terminal and the first node;
    a second switch coupled in series with the resonant inductor; and
    a control circuit configured to:
        close the first switch to apply a first voltage to the first node of the switchable tank circuit, wherein the first voltage has a first polarity with respect to the reference terminal of the switching transistor, and the first voltage is configured to place the switching transistor into a first state, close the second switch to activate the switchable tank circuit after applying the first voltage to the first node, wherein voltage of the first node transitions from the first voltage to a second voltage, the second voltage has a second polarity opposite the first polarity with respect to the reference terminal of the switching transistor, and the second voltage is configured to place the switching transistor in a second state different from the first state, deactivate the switchable tank circuit and isolate a gate of the switching transistor from the first supply terminal and from the reference terminal after the voltage of the first node attains the second polarity, and after deactivating the switchable tank circuit, hold the second voltage at the first node unaided by a power generator, wherein when the first switch is closed, the second switch is open, and when the second switch is closed, the first switch is open.

14. The gate driver circuit of claim 13, further comprising the switching transistor.

15. The gate driver circuit of claim 13, wherein the second switch comprises a first MOSFET coupled in series with a second MOSFET, wherein a body diode of the first MOSFET has an opposite polarity of a body diode of the second MOSFET.

16. The gate driver circuit of claim 13, wherein the control circuit is configured to deactivate the switchable tank circuit by providing a signal to the second switch.

17. The gate driver circuit of claim 13, wherein the control circuit is configured to activate the switchable tank circuit for a predetermined time period, and the predetermined time period is between one-quarter and three-quarters of a resonant time period of the switchable tank circuit.

18. The gate driver circuit of claim 13, where the control circuit further comprises a first switch coupled to the first node of the switchable tank circuit.

19. The gate driver circuit of claim 18, wherein a first terminal of the first switch is directly coupled to the first node.

20. The gate driver circuit of claim 18, further comprising an RC network coupled between a first terminal of the first switch and the first node.

21. The gate driver circuit of claim 13, further comprising a diode having an anode coupled to the first node and a cathode coupled to the reference terminal.

22. The gate driver circuit of claim 13, wherein the resonant capacitor comprises a capacitance a gate-to-source capacitance of the switching transistor.

23. The gate driver circuit of claim 13, wherein the second switch is coupled between the resonant inductor and the first node.

24. A switching gate driver circuit comprising:
a first switch coupled between a gate driver terminal and a first power supply node, the gate driver terminal configured to be coupled to a gate of a switching transistor;
a second switch having a first terminal coupled to the gate driver terminal;
an inductor coupled between a second terminal of the second switch and a second supply terminal, the inductor coupled in series with the second switch; and
a controller comprising
a first switch control output coupled to a control node of the first switch, and
a second switch control output coupled to a control node of the second switch, wherein
the controller is configured to turn-off the first switch and the second switch to isolate the switching transistor from the switching gate driver circuit,
when the first switch is on, the second switch is off, and
when the second switch is on, the first switch is off.

25. The switching gate driver circuit of claim 24, wherein the controller is configured to turn-off the switching transistor by asserting a signal at the second switch control output for a predetermined time period.

26. The switching gate driver circuit of claim 25, wherein the predetermined time period is between one-quarter and three-quarters of a resonant time period of an LC tank formed by the inductor and a capacitance of the switching transistor.

27. The switching gate driver circuit of claim 24, wherein the first switch comprises a MOSFET.

28. The switching gate driver circuit of claim 24, wherein the second switch comprises two MOSFETs connected in series, wherein source connections and body connections of the two MOSFETs are connected together.

29. The switching gate driver circuit of claim 24, wherein when the second switch is turned on, the inductor and an input capacitance of the switching transistor form an LC resonant circuit.

30. The switching gate driver circuit of claim 24, further comprising the switching transistor.

31. The switching gate driver circuit of claim 30, wherein the switching transistor is an enhancement mode GaN GIT.

32. The switching gate driver circuit of claim 24, wherein the first switch is directly coupled to the gate driver terminal.

33. The switching gate driver circuit of claim 24, further comprising an RC network coupled between the first switch and the gate driver terminal.

34. The switching gate driver circuit of claim 24, wherein the second switch comprises a MOSFET and a diode connected in series.

35. The switching gate driver circuit of claim 24, wherein the gate driver terminal is further configured to hold a voltage unaided by a power generator.

36. The switching gate driver circuit of claim 24, further comprising a diode having an anode coupled to the gate driver terminal.

37. The switching gate driver circuit of claim 24, wherein the first terminal of the second switch is directly coupled to the gate driver terminal.

* * * * *